United States Patent [19]

Masuda

[11] Patent Number: 4,985,105
[45] Date of Patent: Jan. 15, 1991

[54] TAPING APPARATUS FOR LEAD FRAME

[75] Inventor: Norihiro Masuda, Nagano, Japan

[73] Assignee: Shinko Electric Industries Co., Ltd., Nagano, Japan

[21] Appl. No.: 468,078

[22] Filed: Jan. 22, 1990

[30] Foreign Application Priority Data

Jan. 21, 1989 [JP] Japan .................................. 1-12277

[51] Int. Cl.⁵ ............................................ B32B 31/18
[52] U.S. Cl. .................................... 156/261; 156/518; 156/530
[58] Field of Search ................. 156/261, 262, 518, 530

[56] References Cited

U.S. PATENT DOCUMENTS

| | | | |
|---|---|---|---|
| 4,279,682 | 7/1981 | Hamagami et al. | 156/518 |
| 4,289,568 | 9/1981 | Trotsky et al. | 156/518 |
| 4,581,096 | 4/1986 | Sato | 156/518 |
| 4,683,023 | 7/1987 | Sokolovsky | 156/530 |
| 4,925,515 | 5/1990 | Yoshimura et al. | 156/530 |

*Primary Examiner*—Caleb Weston
*Attorney, Agent, or Firm*—Staas & Halsey

[57] ABSTRACT

A taping apparatus for adhering taping members to a lead frame, comprising: a die having a punch for cutting a heat-adherent tape to form individual taping members. The taping member is moved and pushed against a surface of a heater block on which a lead frame is rested and heated, so that the taping member is heated and adhered to the lead frame. The tape is intermittently fed along the passage in synchronization with an operation of the die, and before punching slack is provided in the tape.

12 Claims, 5 Drawing Sheets

TAPING APPARATUS FOR LEAD FRAME

BACKGROUND OF THE INVENTION

1. Field of the Invention

The present invention relates to a semiconductor manufacturing technique, and more particularly, to an apparatus for fixing heat-adherent taping members to a lead frame during the manufacture of semiconductor devices. This apparatus is referred hereinafter to as a "taping apparatus". This invention also relates to a method of adhering a heat-adherent taping member to a lead frame.

2. Description of the Related Art

In a taping apparatus conventionally known in the art of semiconductor manufacturing technology, the elongated flexible tape has a structure consisting of two or more layers, i.e., an insulation base film made of a suitable resin, for example, a polyimide film strip, and a heat-adherent layer formed on upper and/or lower surface of the film base. The heat-adherent layer usually is not adhesive at a room temperature but becomes adhesive when heated. The elongated tape is punched and cut to form individual taping members each having a desired configuration, which are then pushed against a heated lead frame, whereby the taping members are continuously adhered to the lead frame.

In this taping apparatus, the heat-adherent tape is intermittently fed through a die, which continuously punches and cuts the tape into individual taping members each having a predetermined shape, the taping member is then lowered and pushed against a lead frame resting on and heated by a heater block located under the die, whereby the taping member is heat-adhered to the lead frame. The means used for continuously and intermittently feeding the tape through the die comprises a pair of feed and pinch rollers located downstream of the die, the feed roller being driven by a suitable pulse motor. The tape is passed through the gap between the pair of rollers of this feeding means and then intermittently fed through the die.

Recently, however, a greater sophistication is required from a taping member for lead frames, and thus the tolerances of the taping member must be more strictly controlled with regard to the shape or dimension thereof; e.g., to within ±0.05 mm or ±0.07 mm. Also, a much thinner tape is now used to make the taping members.

Therefore, if such a thin, flexible tape is fed through the die by the above-mentioned conventional feeding means, the tape would be subjected to a tension force in the die, and thus tape might be deformed therein. Where the tape has pilot apertures, since the tape is under a tension, the apertures might be deformed by a misinsertion of pilot pins of the die, when the pilot pins are inserted to the pilot apertures. Under such circumstances, it becomes difficult to accurately position the tape at a predetermined position in the die, and thus accurate by formed taping members can not be obtained.

SUMMARY OF THE INVENTION

Accordingly, an object of the present invention is to provide a taping apparatus for making taping members used for lead frames, and capable of punching a thin, flexible tape without exerting an excess tension force thereon to cut the tape into individual taping members each having a required accuracy of the shape and dimension thereof.

According to one aspect of this invention, there is provided a taping apparatus for making taping members used for lead frames, comprising: a die having at least one punch for punching and cutting a heat-adherent flexible tape into individual taping members, the punch being provided with a means for holding a cut taping member so that the cut taping member is moved toward a heat-adhesion surface while being held by the punch; a heater block defining the heat-adhesion surface, on which a lead frame is rested and heated thereby, so that when the taping member is pushed against the lead frame, the taping member is heated and adhered to the lead frame; a means for defining a passage for feeding the tape in a longitudinal direction thereof, this passage extending on either side of the die; a means for intermittently feeding the tape along the passage in synchronization with an operation of the die; first and second releasable retaining means for retaining the tape at first and second positions of the feeding passage upstream and downstream of the die with respect to a feeding direction of the tape, respectively; and at least one slack-giving means comprising a member located between the first and second positions in such a manner that it projects across the feeding passage and is retraced therefrom, to provide slack in the tape.

According to another aspect of this invention, there is provided a process for adhering a taping member to a lead frame, comprising the following steps of: intermittently feeding a heat-adherent flexible tape in a longitudinal direction thereof by a predetermined distance in each operation cycle along a feeding passage extending on either side of a die having at least one punch for punching and cutting a heat-adherent flexible tape into individual taping members; releasing the tape along the feeding passage after the tape is fed by a predetermined distance; retaining the tape at first and second positions of the feeding passage upstream and downstream, respectively, of the die with respect to the tape feeding direction; providing slack in the tape at a third position between the first and second positions by a member which is projected across the feeding passage and then retracted therefrom; again retaining the tape at the first and second positions, respectively; actuating the die to punch and cut the tape into individual taping members; and moving the cut taping member toward a heat-adhesion surface on which a lead frame is rested and heated thereby, so that the taping members are pushed against the lead frame to be heated and adhered thereto.

BRIEF DESCRIPTION OF THE DRAWINGS

FIG. 7 is a partial cross-sectional view illustrating the feeding surface of the die providing with notches, indentations, knurls, or the like;

DESCRIPTION OF THE PREFERRED EMBODIMENTS

Figure 1:
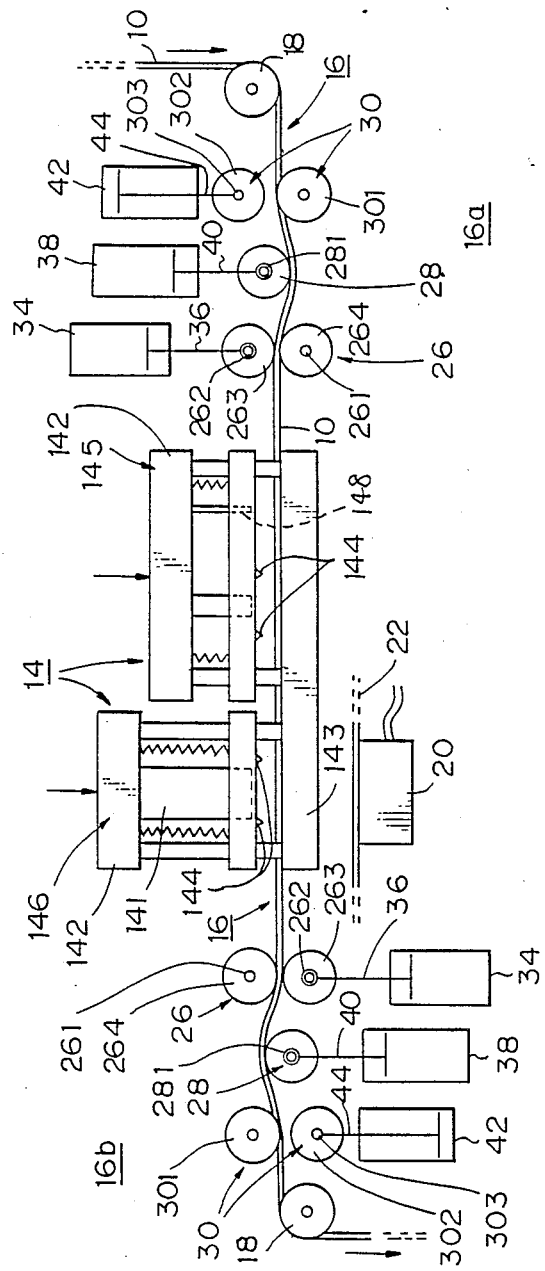
FIG. 1 is an elevational view of the taping apparatus of this invention in one operating position.
Figure 2:
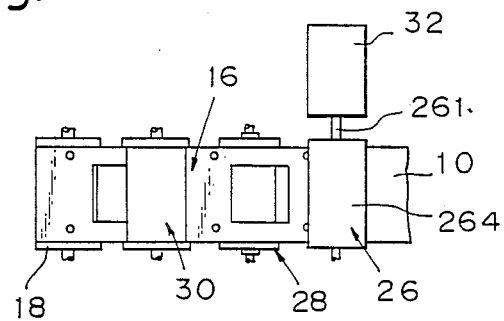
FIG. 2 is a partial plan view of the taping apparatus of FIG. 1, illustrating the tape feeding passage in front of the die.

Referring now to the drawings, wherein FIGS. 1 through 4 show a preferred embodiment of the taping apparatus according to the present invention, wherein die generally denoted by a reference numeral 14 comprises first and second die members 145 and 146 arranged in series with respect to the feeding direction of a work, i.e., an elongated heat-sealable or adherent flexible tape 10 made of a suitable resin, such as a polyimide film strip.

Figure 5:
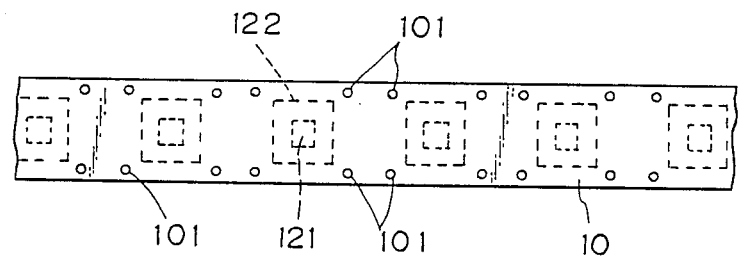
FIG. 5 is a plan view of an elongated heat-adherent tape.

In the die 14, the tape 10 as shown in FIG. 5, which is adhesive with respect to a metal lead frame 22, is stamped or punched and cut into a series of taping members 12 each shaped as a rectangular frame. Namely, the tape 10 is intermittently fed through the die 14, which continuously punches and cuts the tape 10 into individual taping members 12. The first die member 125 continuously punches out the inner rectangular portions, to provide a series of inner openings 121, and the second die member 126 continuously punches out the peripheral portions 122 around the inner opening 121, to thereby form the taping members 12.

Each of the first and second die members 145 and 146 is provided with four pilot pins 144, respectively, which are inserted into pilot apertures 101 continuously arranged at the respective sides of the tape 10, just before the corresponding die members are operated, to adjust the tape 10 to predetermined positions. The projections 148 serve to provide such pilot apertures 101 in the tape 10.

The second die member 146 also has a chuck means 24 provided in a punch 141 thereof for holding the taping member 12 cut from the tape 10. During the downward movement of the punch 141, the chuck means 24 holds the taping member 12 to move it downward until the taping member 12 comes into contact with the lead frame 22 rested on the heater block 20, and the taping member 12 is then heated and adhered to the lead frame 22.

Figure 3A:
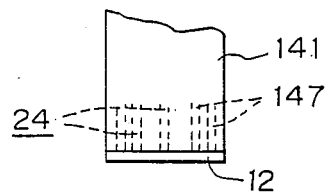
FIG. 3A and 3B are enlarged front and bottom views showing the operation of the punch having a chuck means.
Figure 3B:
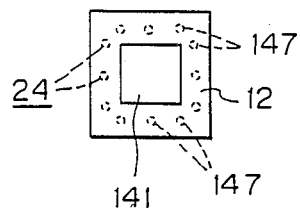

As shown in FIGS. 3A and 3B, the chuck means 24 comprises a plurality of small-sized air suction apertures 147 provided in the tip portion of the punch 141 and a vacuum pump (not shown) for sucking the air from the air apertures 147 to exhaust the sucked air to the outside to hold the taping member 12 by the thus-created suction force. A heat block 20 comprising therein a pipe heater (not shown), for heating the block 20, is located under the die member 146. The punch 141 of the die 146 can be lowered until the tip thereof holding the taping member 12 comes into contact with the upper surface of the heat block 20. The taping member 12 is then pushed against the heated lead frame 22 on the heat block 20 and heated to become adhesive, and thus the taping member 12 is adhered to the lead frame 22.

Figure 4:
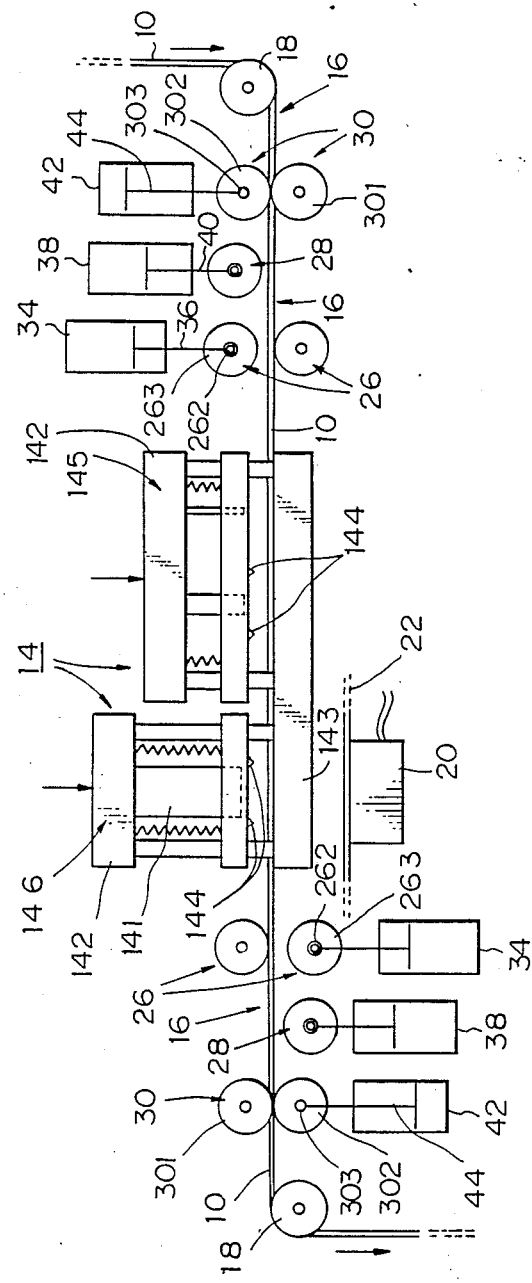
FIG. 4 is an elevational view showing the same taping apparatus as in FIG. 1, but in another operating position.

Both the upstream and downstream of the die 14, the tape feeding passage 16 is provided with one or more guide rollers 18 (only one roller 18 is illustrated in FIG. 1 and 4) rotatably arranged for guiding the tape 10 through the die 14 along the feeding passage 16.

According to the present invention, the feeding passage 16 is further provided with the feeding means mentioned below. Both the upstream and downstream sides 16a and 16b, with respect to the die 14, are provided with a pair of upper and lower feed rollers 26 adjacent to the die 14, a release roller 28, and a pair of upper and lower brake rollers 30 adjacent to the guide roller 18, between the die 14 and the guide roller 18.

The pair of feed rollers 26 comprises a drive roller 264 fixedly mounted on a shaft 261 connected to a pulse motor 32 (FIG. 2) and a pinch or pressure roller 263 rotatably mounted on a shaft 262 connected to a piston rod 36 of an air cylinder 34, which urges the pinch roller 263 toward the drive roller 264 to feed the tape 10, or moves the pinch roller 263 away from the drive roller 264 to release the tape 10.

The release roller 28 located between the feed rollers 26 and the brake rollers 30 is rotatably mounted on a shaft 281 connected to a piston rod 40 of an air cylinder 38, which moves the release roller 28 forward across the feeding passage 16 to bend the tape 10, or moves the release roller 28 backward to retract it from the feeding passage 16.

The pair of brake rollers 30 comprises a free roller 301 rotatably mounted on a fixed shaft and a stop roller 302 fixedly mounted on a shaft 303 connected to a piston rod 44 of an air cylinder 42, which urges the stop roller 302 toward the free roller 301 to retain the tape 10, or moves the stop roller 302 away from the free roller 301 to release the tape 10. In the released position, the free roller 301 operates as an additional guide roller, in cooperation with the guide roller 18.

In the illustrated embodiment, all of the air cylinders 34, 38, and 42 of the upstream feeding passage 16a are arranged above the feeding line, and all of the air cylinders 34, 38, and 42 of the downstream feeding passage 16b are arranged under the feeding line.

The operation of the taping apparatus according to the present invention will now be described with reference to FIGS. 1 through 4.

First, the air cylinders 34 of the up-and downstream passages 16a and 16b are actuated to move the pinch rollers 263 upward and downward, respectively, away from the drive rollers 264 to open respective gaps between the drive and pinch rollers 264 and 263. Simultaneously, the air cylinders 38 of the up- and downstream passages 16a and 16b are actuated to move the release rollers 28 upward and downward, respectively, to the retracted positions thereof. Further, the air cylinders 42 of the up- and downstream passages 16a and 16b are actuated to move the stop rollers 302 upward and downward, respectively, away from the free rollers 301, to open respective gaps between the stop and free rollers 302 and 301.

The tape 10 can thus be set in the upstream and downstream feeding passages 16a and 16b, and consequently, in the upstream feeding passage 16a, the tape 10 passes through the guide roller 18 and the gap between the stop and free rollers 302 and 301, passes near the release roller 28, and passes through the gap between the drive and pinch rollers 264 and 263. Then the tape 10 passes through the die members 145 and 156, in turn, and in the downstream feeding passage 16b, passes through the gap between the drive and pinch rollers 264 and 263, passes near the release roller 28, passes through the gap between the stop and free rollers 302 and 301, and then passes through the guide roller 18.

Then, as shown in FIG. 1, the air cylinders 34 of the upstream and downstream passages 16a and 16b are actuated to move the pinch rollers 263 downward and upward, respectively, toward the drive rollers 264, to pinch the tape 10 between the drive and pinch rollers 264 and 263. The pulse motors 32 are then actuated to rotate the pairs of feed rollers 26, to feed the tape 10 by a predetermined distance via the die 14. Simultaneously, the air cylinders 38 of the upstream and downstream passages 16a and 16b are actuated to move the release rollers 28 downward and upward, respectively, across the respective feeding passages 16a and 16b, to bend the tape 10 and provide some slack therein at the upstream and downstream passages 16a and 16b. Then the pulse motors 32 are stopped to stop the tape 10.

Then, as shown in FIG. 4, the air cylinders 42 of the upstream and downstream passages 16a and 16b are actuated to move the stop rollers 302 downward and upward, respectively, toward the free rollers 301, to close the respective gaps between the stop and free rollers 302 and 301 so that the tape 10 is nipped and braked to be retained therebetween.

The air cylinders 34 of the upstream and downstream passages 16a and 16b are then actuated to move the pinch rollers 263 upward and downward, respectively, away from the drive rollers 264, to open gaps between the drive and pinch rollers 264 and 263. Simultaneously, the air cylinders 38 of the upstream and downstream passages 16a and 16b are actuated to move the release rollers 28 upward and downward, respectively, to the retracted positions thereof, so that the tape 10 is loose and has some slack in it between the pair of rollers 30 of the upstream and downstream passages 16a and 16b. Accordingly an excess tension is not exerted on the tape 10 set in the die 14, i.e., the tape 10 can move slightly in the die 14.

Then the pilot pins 144 of the first and second die members 145 and 146 are moved downward to be inserted into the pilot apertures 101 arranged at the respective sides of the tape 10, so that the tape 10 can be positioned at the predetermined punching positions. During such positioning operations, since the tape 10 is loosely set on these first and second die members 145 and 146, as mentioned above, the tape 10 can be moved slightly forward or backward, to facilitate this positioning.

Figure 6:
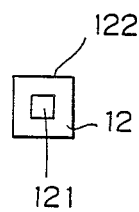
FIG. 6 is a plan view of a taping member cut from the tape.

Then the first and second die members 145 and 146 are actuated to punch the tape 10, in such a manner that the first die member 145 forms the inner opening 121 (FIGS. 5 and 6) and the second die member 146 cuts the tape 10 into an individual rectangular taping member 12 (FIG. 6). During these punching operations, the tape 10 is no longer under tension and, therefore, the taping member 12 can be formed without deformation. Also, since the tape 10 is loosely set in the die 14, in such a manner that the tape 10 can be moved slightly as mentioned above, the pilot apertures 101 of the tape 10 are no longer under tension and, therefore, these pilot apertures 101 are not deformed but are accurately positioned, to set the tape 10 at a predetermined position in the die 14. Therefore, the dimensions of the inner opening 121 and the rectangular outer periphery of the taping member 12 thus formed are accurate and show no strain, deformation, or distortion.

Then the punch 141 of the second die member 146 is further lowered, while holding the taping member 12, until the taping member 12 is pressed against a lead frame 22, which rests on and is heated by the heater block 20, and the taping member 12 is thus heat-adhered to the lead frame 22.

The above-mentioned operation is repeated continuously and intermittently, so that the taping members 12 are adhered, one by one, to the lead frame 22, which is also intermittently fed in synchronization with the movement of the tape 10.

Figure 7:
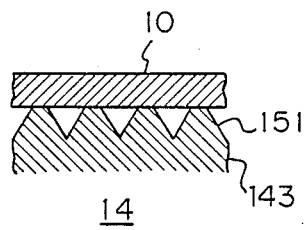
Figure 8:
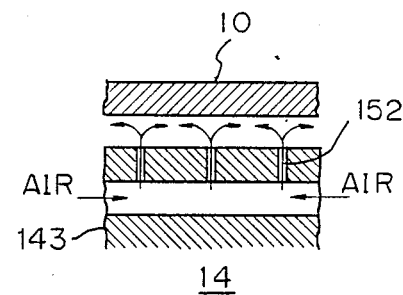
FIG. 8 is a partial cross-sectional view of another embodiment of the feeding surface of the die providing with air jets.
Figure 9:
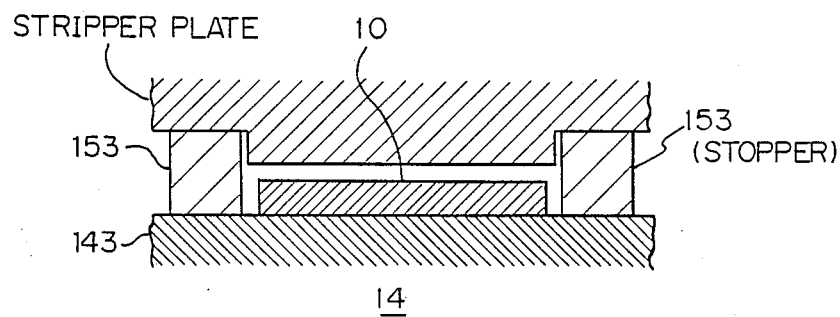
FIG. 9 is a partial cross-sectional view of still another embodiment of the feeding surface of the die providing with stoppers.

In this embodiment, if an unfavorable adhesion force was generated at the heat-adherent face of the tape 10 in, for example, a high temperature or humid environment, the tape 10 would be reluctantly adhered to the feeding surface of the tape passage 16 and would be partially deformed if a tension was exerted on the tape 10. Therefore, to prevent an adhesion of the tape 10 to the feeding surface of the tape passage 16, preferably the tape passage 16 in the die 14 is provided, on the feeding surface thereof, with notches, indentations, knurls or the like 151, as shown in FIG. 7, or a plurality of air jets 152 for injecting air to slightly raise the tape 10, as shown in FIG. 8. Any mechanical stopper such as shown at 153 in FIG. 9, may be provided for the same purpose, to prevent parts of the die 14 other than the punches 141 and 142 from pushing against or coming into contact with the tape 10. Accordingly, taping members 12 having predetermined accurate and uniform dimensions can be always obtained regardless of the environmental conditions.

Although, in the embodiment mentioned above, the guide rollers 18 are arranged upstream and downstream of the rollers 30 in the first and second feeding passage 16a and 16b, respectively, the guide rollers 18 may be arranged adjacent to the die 14 in the first and second feeding passages 16a and 16b, respectively, or between the feed rollers 26 and the stop rollers 30 in the first and second feeding passages 16a and 16b, respectively.

As will be understood, the present invention is applicable to any taping apparatus having a die consisting of one, two or more die members used for punching and cutting an insulative longitudinal strip tape into individual taping members each having any desired simple or complicated configuration. Further, this invention is also applicable to a taping apparatus having a die without pilot pins. Also, the tape 10 may consist of a film base and an heat-adherent layer, or may made of single base film which is, per se, heat-adherent.

I claim:

1. A taping apparatus for making taping members used for lead frames, comprising:
   a die having at least one punch for punching and cutting a heat-adherent flexible tape into individual taping members, said punch being provided with means for holding a cut taping member so that said cut taping member is moved toward a heat-adhesion surface while held by said punch;
   a heater block defining said heat-adhesion surface on which a lead frame is rested and heated thereby, said taping member being pushed against said lead frame in such a manner that said taping member is heated and adhered to said lead frame;
   means for defining a passage for feeding said tape in a longitudinal direction thereof, said passage extending either side of said die;
   means for intermittently feeding said tape along said passage in synchronization with an operation of said die;

first and second releasable retaining means for retaining said tape at first and second positions of said feeding passage upstream and downstream of said die with respect to a feeding direction of the tape, respectively; and at least one slack-providing means comprising a member located between said first and second positions in such a manner as to project across said feeding passage and be retracted therefrom to provide slack in said tape.

2. A taping apparatus as claimed in claim 1, wherein each of said first and second retaining means comprises a pair of rollers, one of said pair of rollers being freely and rotatably mounted on a fixed shaft and the other of said pair of rollers being fixedly secured to an actuator which moves said other roller in such a manner that said tape is retained between said rollers when said other roller is in close contact with said one roller and released when said other roller is moved away from said one roller.

3. A taping apparatus as claimed in claim 2, wherein said actuator is a hydraulic or pneumatic cylinder having a piston rod to which said other roller is connected.

4. A taping apparatus as claimed in claim 1, wherein said member of said slack-providing means is a roller freely and rotatably mounted on a shaft connected to an actuator which moves said roller between a projected position in which said roller is projected toward said feeding passage so as to be positioned at least partially across said feeding passage and a retracted position in which said roller is completely removed from said feeding passage.

5. A taping apparatus as claimed in claim 4, wherein said free and rotatable roller is moved perpendicular to said feeding passage between projected and retracted positions thereof.

6. A taping apparatus as claimed in claim 4, wherein said actuator is a hydraulic or pneumatic cylinder having a piston rod to which said free and rotatable roller is connected.

7. A taping apparatus as claimed in claim 1, wherein two of said slack-providing means are provided, one of said slack-providing means being located between said first retaining means and said die and the other being located between said die and said second retaining means.

8. A taping apparatus as claimed in claim 1, wherein said means for intermittently feeding said tape comprises a pair of rollers, one of said pair of rollers being a drive roller operatively connected to a pulse motor and the other of said pair of rollers being a pinch or pressure roller which can be moved toward and away from said drive roller to define a pinching gap therebetween for feeding said tape.

9. A taping apparatus as claimed in claim 1, wherein said feeding passage definging means is provided on a feeding surface thereof with notches, indentations, knurls or the like to prevent an unfavorable adhesion of the tape 10 to said feeding surface.

10. A taping apparatus as claimed in claim 1, wherein said feeding passage definging means is provided on a feeding surface thereof with a plurality of air jets for injecting air to slightly raise said tape.

11. A taping apparatus as claimed in claim 1, wherein said die is provided with stopper means for preventing part of said die other than said punches form pushing against or coming into contact with said tape.

12. A process for adhering a taping member to a lead frame, comprising the following steps of:

intermittently feeding a heat-adherent flexible tape in a longitudinal direction thereof by a predetermined distance of each operation cycle along a feeding passage extending either side of a die having at least one punch for punching and cutting a heat-adherent flexible tape into individual taping members;

releasing said tape along said feeding passage after said tape is fed by said predetermined distance;

retaining said tape at first and second positions of said feeding passage upstream and downstream, respectively, of said die with respect to the feeding direction;

providing slack in said tape at a third position between said first and second positions by a member which is projected across said feeding passage and then retracted therefrom;

again retaining said tape at said first and second positions, respectively;

actuating said die to punch and cut said tape into individual taping members; and moving said cut taping member toward a heat-adhesion surface on which a lead frame is rested and heated thereby, so that said taping member is pushed against said lead to be heated and adhered thereto.

* * * * *

UNITED STATES PATENT AND TRADEMARK OFFICE
CERTIFICATE OF CORRECTION

PATENT NO. : 4,985,105

DATED : January 15, 1991

INVENTOR(S) : Norihiro MASUDA

It is certified that error appears in the above-identified patent and that said Letters Patent is hereby corrected as shown below:

Col. 1, line 60, change "accurate by" to --accurately--.

Col. 6, line 47, change "an" to --a--.

Col. 8, line 8, change "definging" to --defining--;
line 13, change "definging" to --defining--;
line 18, change "form" to --from--.

Signed and Sealed this

Thirteenth Day of July, 1993

Attest:

MICHAEL K. KIRK

Attesting Officer

Acting Commissioner of Patents and Trademarks